US010481390B2

(12) United States Patent
Maruyama et al.

(10) Patent No.: US 10,481,390 B2
(45) Date of Patent: Nov. 19, 2019

(54) OPTICAL SCANNING DEVICE AND MANUFACTURING METHOD OF OPTICAL SCANNING DEVICE

(71) Applicants: Yuki Maruyama, Tokyo (JP); Tsukasa Yamada, Tokyo (JP)

(72) Inventors: Yuki Maruyama, Tokyo (JP); Tsukasa Yamada, Tokyo (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 204 days.

(21) Appl. No.: 15/699,346

(22) Filed: Sep. 8, 2017

(65) Prior Publication Data

US 2018/0088321 A1 Mar. 29, 2018

(30) Foreign Application Priority Data

Sep. 29, 2016 (JP) .................................. 2016-191293

(51) Int. Cl.
*G02B 26/08* (2006.01)
*G02B 26/10* (2006.01)

(52) U.S. Cl.
CPC ......... *G02B 26/0858* (2013.01); *G02B 26/10* (2013.01)

(58) Field of Classification Search
CPC .. G02B 26/10; G02B 26/101; G02B 26/0833; G02B 26/0858; B81B 3/0072; B81B 2201/032; B81B 2201/042; B81B 2203/058
USPC ..................................................... 359/199.4
See application file for complete search history.

(56) References Cited

U.S. PATENT DOCUMENTS

| 2011/0233693 | A1 | 9/2011 | Perruchot et al. |
| 2013/0201259 | A1* | 8/2013 | Shklyarevskiy ..... B41J 2/14233 347/71 |
| 2016/0240768 | A1 | 8/2016 | Fujii et al. |
| 2016/0274354 | A1* | 9/2016 | Fujimoto ............. G02B 26/101 |

FOREIGN PATENT DOCUMENTS

| JP | 2010-128116 | 6/2010 |
| JP | 2014-238581 | 12/2014 |
| JP | 2016-004155 | 1/2016 |

OTHER PUBLICATIONS

Extended European search report for European Patent Application No. 17190941.9 dated Mar. 6, 2018.

* cited by examiner

*Primary Examiner* — Euncha P Cherry
(74) *Attorney, Agent, or Firm* — IPUSA, PLLC

(57) ABSTRACT

An optical scanning device is provided. The optical scanning device includes a mirror having an optical reflection surface, a movable frame supporting the mirror, a pair of drive beams supporting the movable frame from both sides, a drive source, disposed on the drive beams, that causes the movable frame to be swung around a predetermined axis, a fixed frame supporting the drive beams. Each of the drive source includes a lower electrode formed on the drive beams, a piezoelectric thin film formed on the lower electrode, an upper electrode formed on the piezoelectric thin film, and a stress counter film, formed on the upper electrode or formed between the piezoelectric thin film and the upper electrode, that generates a compressive stress on the drive beams.

5 Claims, 11 Drawing Sheets

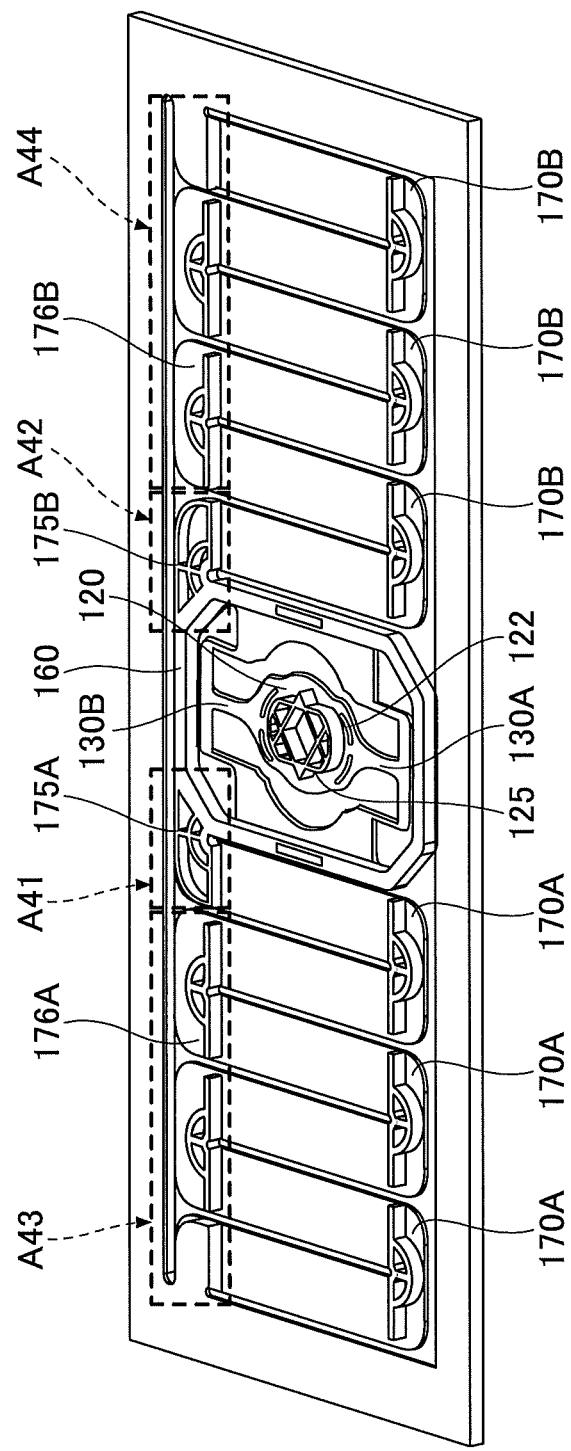

OPTICAL SCANNING DEVICE AND MANUFACTURING METHOD OF OPTICAL SCANNING DEVICE

BACKGROUND OF THE INVENTION

1. Field of the Invention

The present invention relates to an optical scanning device and a manufacturing method of the optical scanning device.

2. Description of the Related Art

Conventionally, an optical scanning device is known that includes a movable plate that has an optical reflection surface for reflecting incident light, a torsion beam that supports the movable plate in such a way that the movable plate is enabled to rotate around the torsion beam, and a drive source that applies a force in a twisting direction to the torsion beam (e.g., refer to Patent Document 1). In this optical scanning device, in order to suppress distortions of the optical reflection surface at the time of rotation, ribs are formed on a lower surface that includes vicinities of connection parts of the movable plate and the torsion beams.

CITATION LIST

Patent Document

[Patent Document 1] Japanese Unexamined Patent Application Publication No. 2010-128116

SUMMARY OF THE INVENTION

Technical Problem

However, in the optical scanning device described in Patent Document 1, there is a problem in that a stress is concentrated in the vicinity of the ribs, and thus, the device tends to be damaged. Further, even if the device is not damaged, there is a problem in that, because the stress is repeatedly applied to the vicinity of the ribs, material fatigue is caused by the repeated stress, and thus, performance degradation is introduced.

The present invention has been made in view of the above. An object of the present invention is to reduce the damages and the material fatigue of the optical scanning device.

Solution to Problem

In order to achieve the above object, an optical scanning device (1000) according to an aspect of the present invention includes a mirror (110) having an optical reflection surface, a movable frame (160) supporting the mirror (110), a pair of drive beams (170A, 170B) supporting the movable frame (160) from both sides, drive sources (171A, 171B), disposed on the drive beams (170A, 170B), that cause the movable frame (160) to be swung around a predetermined axis, and a fixed frame (180) supporting the drive beams (170A, 170B). Each of the drive sources (171A, 171B) includes a lower electrode (3) formed on the drive beams (170A, 170B), a piezoelectric thin film (4, 6) formed on the lower electrode (3), an upper electrode (7) formed on the piezoelectric thin film (4, 6), and a stress counter film (8), formed on the upper electrode (7) or formed between the piezoelectric thin film (4, 6) and the upper electrode (7), that generates a compressive stress on the drive beams.

It should be noted that reference numerals in the above parentheses are provided in order to facilitate easy understanding, are just examples, and are not limited to aspects illustrated in the drawings.

Advantageous Effects of Invention

According to an embodiment of the present invention, it is possible to reduce the damaging of the optical scanning device and the material fatigue.

BRIEF DESCRIPTION OF THE DRAWINGS

FIG. 4 is a lower surface side perspective view illustrating an example of an optical scanning unit of an optical scanning device according to the first embodiment.

DETAILED DESCRIPTION OF THE PREFERRED EMBODIMENTS

Figure 1:
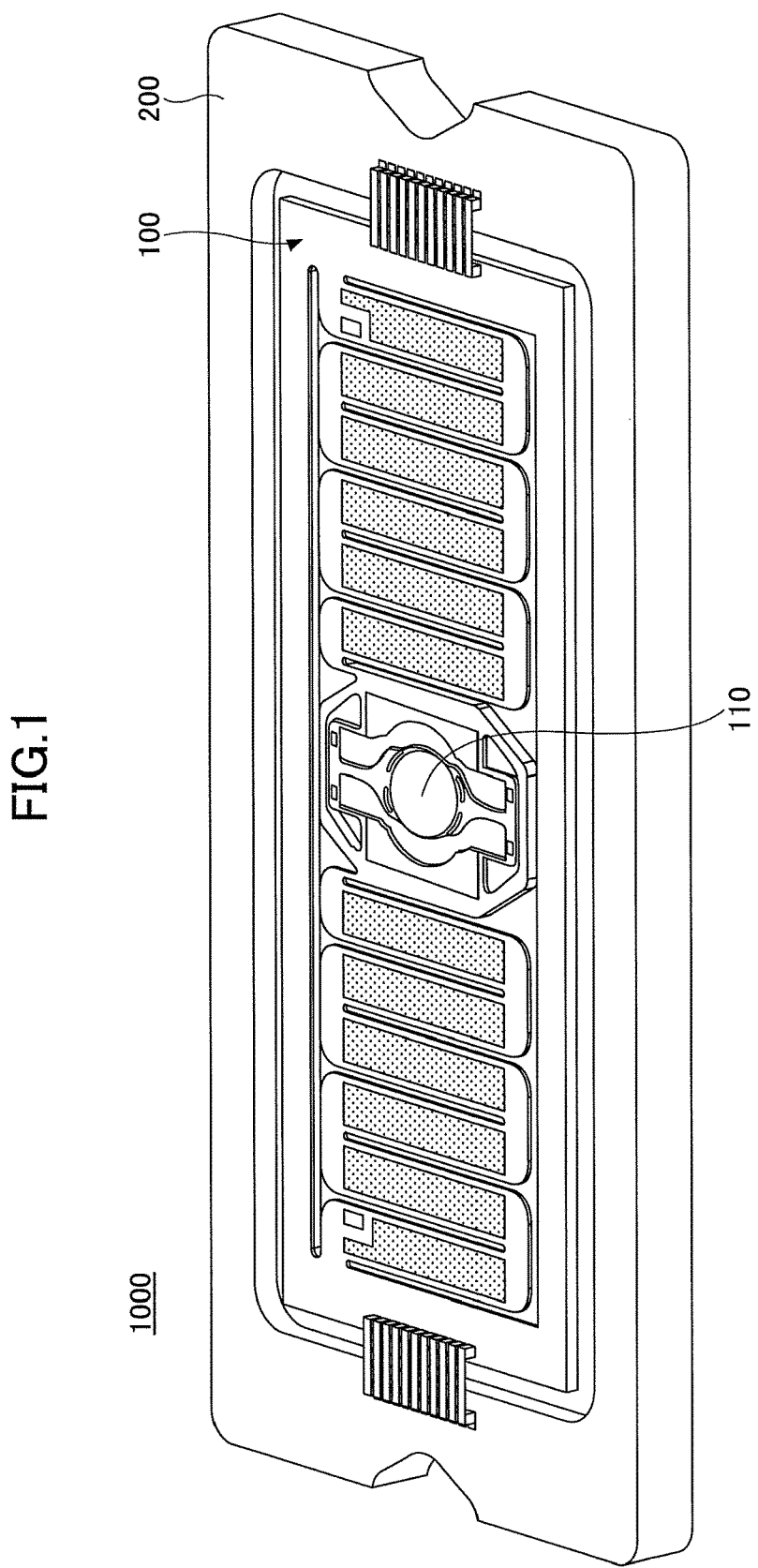
FIG. 1 is a perspective view (1) illustrating an example of an optical scanning device according to a first embodiment of the present invention.

In the following, embodiments of the present invention will be described while making reference to the drawings. Throughout the drawings, a same reference numeral is given to a same element, and duplicated descriptions may be omitted.

First Embodiment

Figure 2:
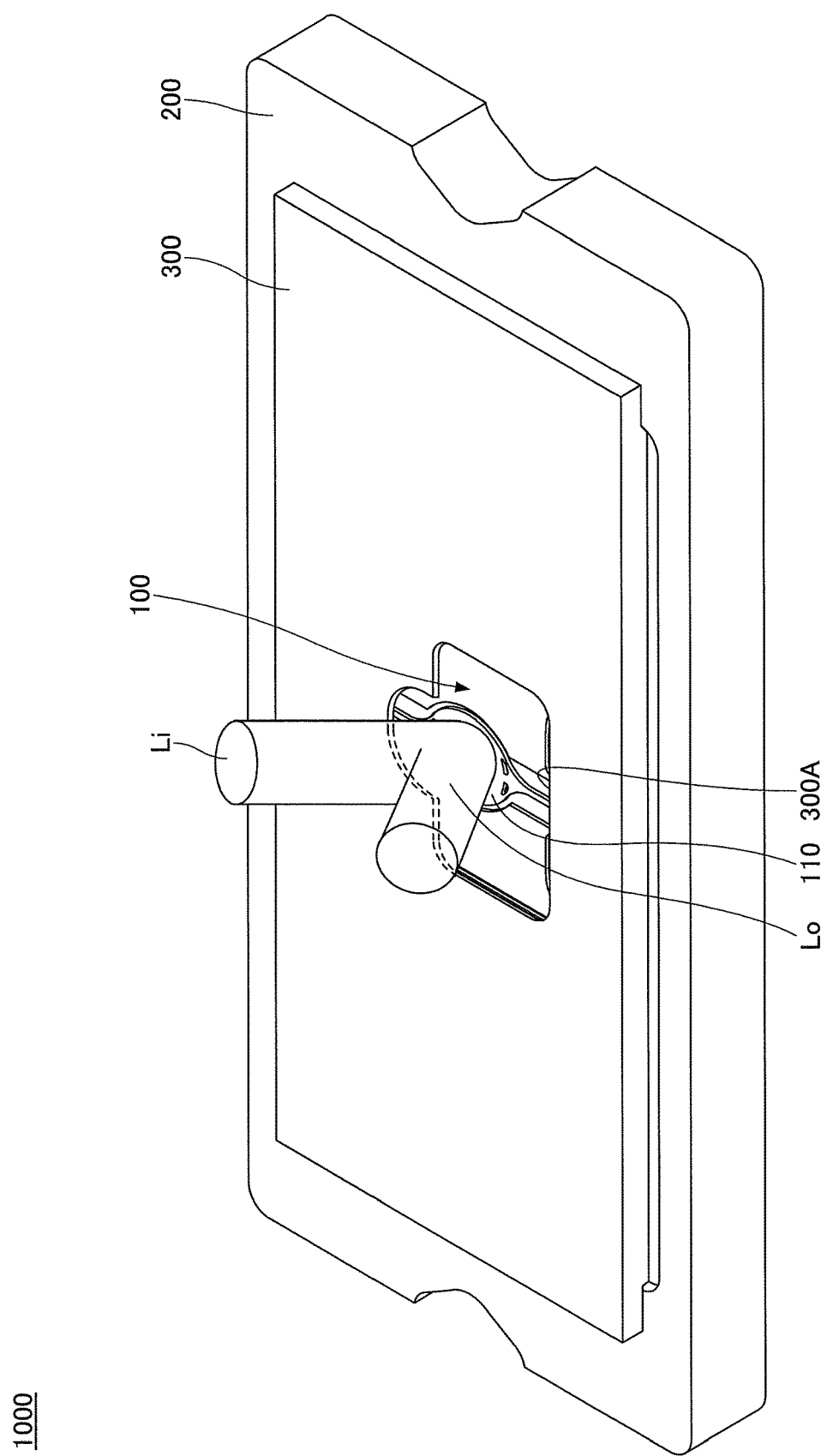
FIG. 2 is a perspective view (2) illustrating an example of an optical scanning device according to the first embodiment.

First, an optical scanning device according to a first embodiment of the present invention will be described. FIG. 1 and FIG. 2 are perspective views illustrating an example of an optical scanning device 1000 according to the first embodiment. FIG. 1 illustrates the optical scanning device 1000 in a state in which a package cover is detached. FIG. 2 illustrates the optical scanning device 1000 in a state in which the package cover is attached.

As illustrated in FIG. 1 and FIG. 2, the optical scanning device 1000 includes an optical scanning unit 100, a ceramic package 200 on which the optical scanning unit 100 is mounted, and a package cover 300 that is disposed on the ceramic package 200 and that covers the optical scanning unit 100. The optical scanning device 1000 may include a substrate, a control circuit, etc., on lower side of the ceramic package 200.

In the optical scanning device 1000, substantially in the center part of the package cover 300, an opening 300A, from which the vicinity of a mirror 110 that has an optical reflection surface is exposed, is provided. It is assumed that the opening 300A has a shape that does not block incident laser light Li that is incident onto the mirror 110 and outgoing laser light Lo (scanning light). It should be noted that, in the opening 300A, the side, through which the incident laser light Li passes, has a smaller opening than the side through which the outgoing laser light Lo passes. In other words, the incident laser light Li side of the opening 300A has a smaller opening with substantially a semicircular shape, and the outgoing laser light Lo side of the opening 300A has a larger opening with substantially a rectangle shape. This is because the incident laser light Li is incident from a fixed direction, and thus, the opening should be provided only for the fixed direction. On the other hand, the outgoing laser light Lo is scanned in two dimensions, and thus, the opening should be provided for all of the scanning range so that the outgoing laser light Lo, which is scanned in two dimensions, is not blocked.

Figure 3:
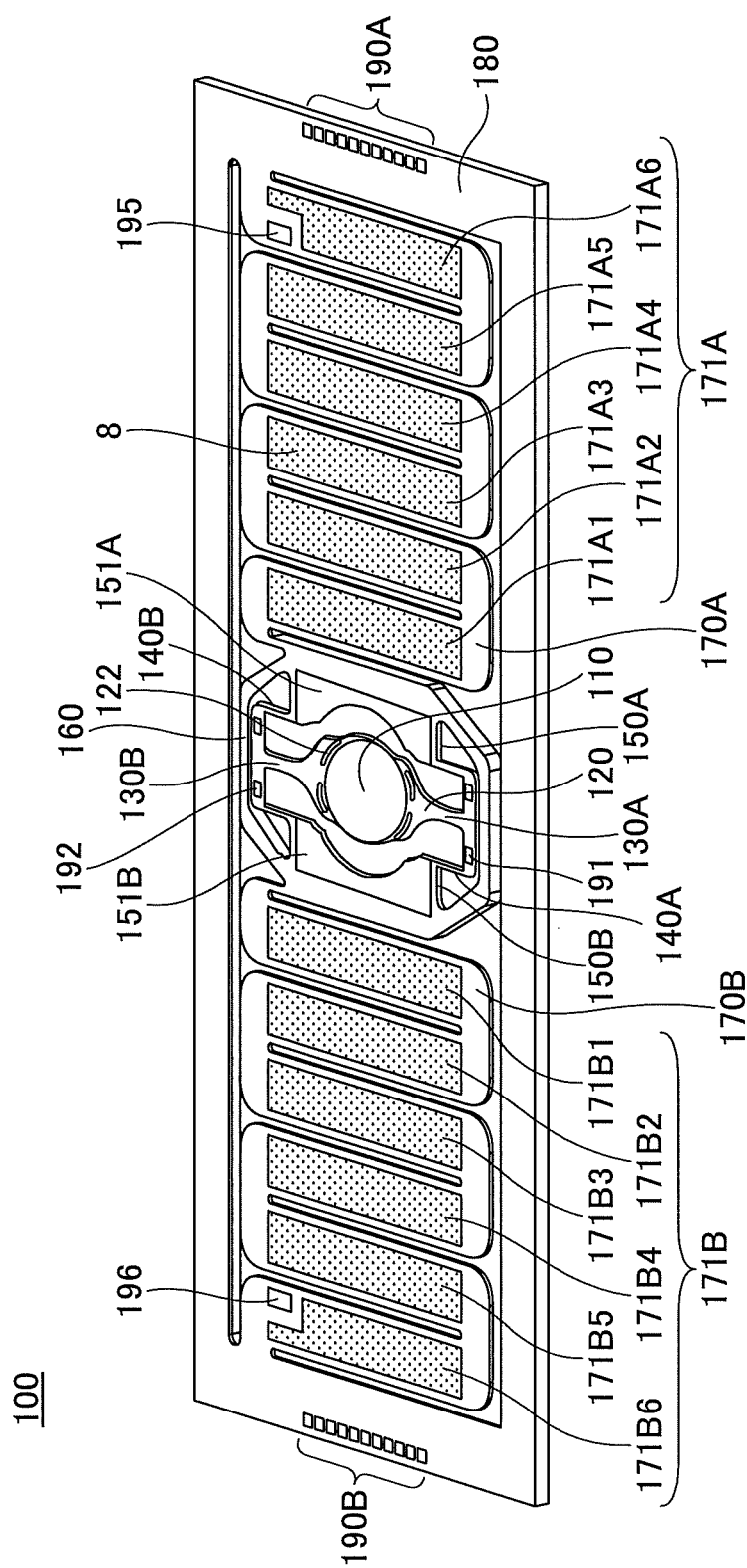
FIG. 3 is an upper surface side perspective view illustrating an example of an optical scanning unit of an optical scanning device according to the first embodiment.

Next, an optical scanning unit 100 of the optical scanning device 1000 will be described. FIG. 3 is an upper surface side perspective view illustrating an example of the optical scanning unit 100 of the optical scanning device 1000 according to the first embodiment.

As illustrated in FIG. 3, the optical scanning unit 100 causes the laser light emitted from the light source to be scanned by causing the mirror 110 to swing. The optical scanning unit 100 may be, for example, a MEMS (Micro Electro Mechanical Systems) mirror that drives the mirror 110 by using a piezoelectric element. In the optical scanning unit 100, a stress counter film 8, which generates a compressive stress on an upper electrode or between a piezoelectric thin film and the upper electrode, is formed in drive sources 171A, 171B that are formed on upper surfaces of a pair of second drive beams 170A, 170B. According to the above arrangement, a plane formed by the second drive beams 170A, 170B is substantially the same as a plane formed by a fixed frame 180. The detail will be described in the following.

The optical scanning unit 100 includes the mirror 110, a mirror support unit 120, twist beams 130A, 130B, connection beams 140A, 140B, first drive beams 150A, 150B, a movable frame 160, the second drive beams 170A, 170B, and the fixed frame 180. Further, the first drive beams 150A, 150B include drive sources 151A, 151B, respectively. Further, the second drive beams 170A, 170B include drive sources 171A, 171B, respectively. The first drive beams 150A, 150B and the second drive beams 170A, 170B function as actuators that cause the mirror 110 to be swung in an up-and-down direction (vertical direction) and in a left-and-right direction (horizontal direction) and cause the laser light to be scanned.

In the mirror support unit 120, slits 122 are formed along the circumference of the mirror 110. According to the slits 122, not only the weight of the mirror support unit 120 is decreased, but also the twisting caused by the twist beams 130A, 130B can be transmitted to the mirror 110.

In the optical scanning unit 100, the mirror 110 is supported by an upper surface of the mirror support unit 120, and the mirror support unit 120 is connected to end portions of the twist beams 130A, 130B that are disposed on both sides of the mirror support unit 120. A swing axis is formed by the twist beams 130A, 130B. The twist beams 130A, 130B are disposed in the swing axis direction and support the mirror support unit 120 from both sides in the axial direction. The twisting of the twist beams 130A, 130B causes the mirror 110, which is supported by the mirror support unit 120, to swing, and the light, which has been emitted to the mirror 110 and reflected by the mirror 110, is caused to be scanned. The twist beams 130A, 130B are connected to, and supported by the connection beams 140A, 140B, and connected to the first drive beams 150A, 150B.

The first drive beams 150A, 150B, the connection beams 140A, 140B, the twist beams 130A, 130B, the mirror support unit 120, and the mirror 110 are supported by the movable frame 160 from outside. One side of the first drive beam 150A and one side of the first drive beam 150B are supported by the movable frame 160. The other side of the first drive beam 150A extends to the inner circumference side and is connected to the connection beams 140A, 140B. Similarly, the other side of the first drive beam 150B extends to the inner circumference side and is connected to the connection beams 140A, 140B.

The first drive beams 150A, 150B are provided as a pair in a direction orthogonal to the twist beams 130A, 130B in such a way that the mirror 110 and the mirror support unit 120 are sandwiched by the first drive beams 150A, 150B. Drive sources 151A, 151B are formed on the upper surfaces of the first drive beams 150A, 150B, respectively. The drive sources 151A, 151B include upper electrodes formed on thin films of piezoelectric elements (hereinafter, referred to as "piezoelectric thin films") on upper surfaces of the first drive beams 150A, 150B, and lower electrodes formed on lower surfaces of the piezoelectric thin films. The drive sources 151A, 151B expand and contract according to the polarity of the drive voltage applied to the upper electrodes and the lower electrodes.

Therefore, by alternately applying drive voltages that have phases different from each other to the first drive beam 150A and the first drive beam 150B, the first drive beam 150A and the first drive beam 150B, disposed on the left side and the right side of the mirror 110, are caused to oscillate in a vertical direction opposite to each other. According to this operation, it is possible to cause the mirror 110 to be swung around the twisting beams 130A, 130B as a swing axis or a rotational axis. Hereinafter, the direction, in which the mirror 110 is swung around the twisting beams 130A, 130B as an axis, is referred to as a horizontal direction. Resonance vibration, for example, can be used for the horizontal drive by the first drive beams 150A, 150B, and can be used for quickly driving the mirror 110 to swing.

Further, one end of the second drive beam 170A and one end of the second drive beam 170B are connected to the outside of the movable frame 160. The second drive beams 170A, 170B are provided as a pair in such a way that the movable frame 160 is sandwiched from left side and right side by the second drive beams 170A, 170B, and that the movable frame 160 is swung around a predetermined axis that passes through the center of the optical reflection surface. The second drive beam 170A has a zigzag shape as a whole by having each of a plural number (e.g., even number) of rectangle beams, which are disposed in parallel with the first drive beam 150A, connected to an adjacent rectangle beam at the end. Further, the other end of the second drive beam 170A is connected to the inside of the fixed frame 180. Similarly, the second drive beam 170B has a zigzag shape as a whole by having each of a plural number (e.g., even number) of rectangle beams, which are disposed in parallel with the first drive beam 150B, connected to an adjacent rectangle beam at the end. Further, the other end of the second drive beam 170B is connected to the inside of the fixed frame 180.

On upper surfaces of the second drive beams 170A, 170B, drive sources 171A, 171B are formed as rectangle units that do not include curved portions. The drive source 171A includes an upper electrode that is formed on a piezoelectric thin film on an upper surface of the second drive beam 170A, a stress counter film 8 that is formed on an upper surface of the upper electrode, and a lower electrode that is formed on a lower surface of the piezoelectric thin film. The drive source 171B includes an upper electrode that is formed on a piezoelectric thin film on an upper surface of the second drive beam 170B, a stress counter film 8 that is formed on an upper surface of the upper electrode, and a lower electrode that is formed on a lower surface of the piezoelectric thin film. It should be noted that the stress counter film 8 is not formed in an area in which the piezoelectric thin film is not formed. This is because, if a stress counter film 8 is formed in an area in which the piezoelectric thin film is not formed, a new stress is generated by the stress counter film 8 on unnecessary places and causes deformations and damages. The drive sources 171A, 171B will be described in detail later.

By applying drive voltages that have polarities different from each other to adjacent rectangle units of drive sources 171A, 171B, the second drive beams 170A, 170B cause adjacent rectangle beams to warp vertically in directions opposite to each other, and transmit accumulated vertical movements of the rectangle beams to the movable frame 160. According to this operation of the second drive beams 170A, 170B, the mirror 110 is caused to be swung in a vertical direction that is orthogonal to the parallel direction. For example, non-resonant vibration can be used for the vertical drive by the second drive beams 170A, 170B.

For example, it is assumed that the drive source 171A includes drive sources 171A1, 171A2, 171A3, 171A4, 171A5, and 171A6 that are disposed in series from the movable frame 160 side toward the right side. Further, it is assumed that the drive source 171B includes drive sources 171B1, 171B2, 171B3, 171B4, 171B5, and 171B6 that are disposed in series from the movable frame 160 side toward the left side. In this case, by driving the drive sources 171A1, 171B1, 171A3, 171B3, 171A5, and 171B5 with a first same waveform voltage, and by driving the drive sources 171A2, 171B2, 171A4, 171B4, 171A6, and 171B6 with a second same waveform voltage different from the first same waveform voltage, it is possible to swing in the vertical direction.

Drive wires used for applying drive voltages to an upper electrode and a lower electrode of the drive source 151A are connected to predetermined terminals included in a group of terminals 190A disposed on the fixed frame 180. Further, drive wires used for applying drive voltages to an upper electrode and a lower electrode of the drive source 151B are connected to predetermined terminals included in a group of terminals 190B disposed on the fixed frame 180. Further, drive wires used for applying upper electrodes and lower electrodes of the drive source 171A are connected to predetermined terminals included in the group of terminals 190A disposed on the fixed frame 180. Further, drive wires used for applying upper electrodes and lower electrodes of the drive source 171B are connected to predetermined terminals included in the group of terminals 190B disposed on the fixed frame 180.

Further, the optical scanning unit 100 includes piezoelectric sensors 191, 192 as horizontal swing angle sensors that detect a tilted degree of the mirror 110 in the horizontal direction (swing angle in the horizontal direction) in a state where the drive voltages are applied to the drive sources 151A, 151B and where the mirror 110 is caused to be swung in the horizontal direction. The piezoelectric sensor 191 is disposed on the connection beam 140A and the piezoelectric sensor 192 is disposed on the connection beam 140B.

Further, the optical scanning unit 100 includes piezoelectric sensors 195, 196 as vertical swing angle sensors that detect a tilted degree of the mirror 110 in the vertical direction (swing angle in the vertical direction) in a state where the drive voltages are applied to the drive sources 171A, 171B and where the mirror 110 is caused to be swung in the vertical direction. The piezoelectric sensor 195 is disposed on one of the rectangle beams included in the second drive beam 170A and the piezoelectric sensor 196 is disposed on one of the rectangle beams included in the second drive beam 170B.

The piezoelectric sensor 191 outputs a current value corresponding to displacement of the connection beam 140A transmitted from the twist beam 130A according to a tilted degree of the mirror 110 in the horizontal direction. The piezoelectric sensor 192 outputs a current value corresponding to displacement of the connection beam 140B transmitted from the twist beam 130B according to a tilted degree of the mirror 110 in the horizontal direction. The piezoelectric sensor 195 outputs a current value corresponding to displacement of the rectangle beam of the second drive beam 170A on which the piezoelectric sensor 195 is disposed, according to a tilted degree of the mirror 110 in the vertical direction. The piezoelectric sensor 196 outputs a current value corresponding to displacement of the rectangle beam of the second drive beam 170B on which the piezoelectric sensor 196 is disposed, according to a tilted degree of the mirror 110 in the vertical direction.

In the present embodiment, a tilted degree of the mirror 110 in the horizontal direction is detected by using the piezoelectric sensors 191, 192, and a tilted degree of the mirror 110 in the vertical direction is detected by using the piezoelectric sensors 195, 196. It should be noted that a tilted degree detection unit, which detects tilted degrees of the mirror 110 according to the current values output from the piezoelectric sensors, may be provided outside of the optical scanning unit 100. Further, a drive control unit, which controls drive voltages supplied to the drive sources 151A, 151B and the drive sources 171A, 171B based on a detection result of the tilted degree detection unit, may be provided outside of the optical scanning unit 100.

The piezoelectric sensors 191, 192, 195, 196 include upper electrodes formed on upper surfaces of piezoelectric thin films and include lower electrodes formed on lower surfaces of the piezoelectric thin films. In the present embodiment, outputs from the piezoelectric sensors are current values of the sensor wires connected to the upper electrodes and the lower electrodes.

Sensor wires drawn out from the upper electrode and the lower electrode of the piezoelectric sensor 191 are connected to predetermined terminals included in the group of terminals 190B disposed on the fixed frame 180. Further, sensor wires drawn out from the upper electrode and the lower electrode of the piezoelectric sensor 195 are connected to predetermined terminals included in the group of terminals 190A disposed on the fixed frame 180. Further, sensor wires drawn out from the upper electrode and the lower electrode of the piezoelectric sensor 192 are connected to predetermined terminals included in the group of terminals 190B disposed on the fixed frame 180. Further, sensor wires drawn out from the upper electrode and the lower electrode of the piezoelectric sensor 196 are connected to predetermined terminals included in the group of terminals 190B disposed on the fixed frame 180.

FIG. 4 is a lower surface side perspective view illustrating an example of an optical scanning unit of an optical scanning device according to the first embodiment. As illustrated in FIG. 4, a rib 125 is provided on a lower surface of the mirror support unit 120. By providing the rib 125, it is possible to reduce occurrences of distortion of the mirror 110 and to keep the mirror 110 flat when driving the mirror 110. The rib 125 is formed in such a way that the outline of the rib 125 substantially matches the shape of the mirror 110. With this arrangement, it is possible to keep the entire mirror 110 flat. Further, by providing the slits 122 formed in the mirror support unit 120, it is possible to distribute a stress transmitted from the twist beams 130A, 130B in the mirror support unit 120, and to prevent the stress from being transmitted to the rib 125.

In lower surfaces of the second drive beams 170A, 17B, ribs 175A, 175B are provided in connection portions (areas indicated by A41, A42 in FIG. 4) via which the movable frame 160 and the second drive beams 170A, 170B are connected. By providing the ribs 175A, 175B, the portions, via which the movable frame 160 and the drive beams are connected, are reinforced, and deformations are prevented by the increased rigidity. Further, in lower surfaces of the second drive beams 170A, 17B, ribs 176A, 176B are provided in connection portions (areas indicated by A43, A44 in FIG. 4) via which adjacent drive beams are connected. By providing the ribs 176A, 176B, the portions, via which the adjacent drive beams are connected, are reinforced, and deformations are prevented by the increased rigidity.

Figure 5A:
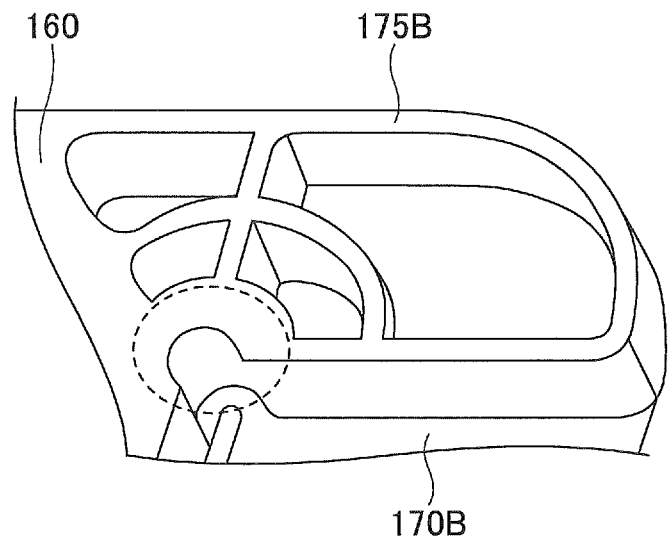
FIGS. 5A-5B are drawings illustrating a stress in the vicinity of a rib in FIG. 4.
Figure 5B:
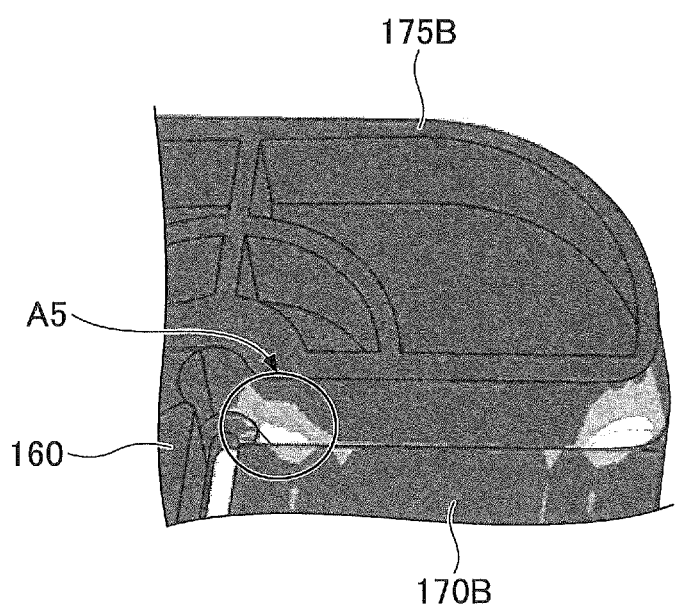

Next, the rib 175B will be described. FIGS. 5A-5B are drawings illustrating a stress in the vicinity of the rib 175B in FIG. 4. FIG. 5A is an enlarged view of the vicinity of the rib 175B in FIG. 4. FIG. 5B is a drawing illustrating a degree of a stress in an area in FIG. 5A. FIG. 5B illustrates that the stress is greater as the color is closer to white, and that the stress is less as the color is closer to black. It should be noted that the rib 175B will be described below as an example and the same description can be applied to the ribs 175A, 176A, and 176B.

The optical scanning unit 100 can be formed by using, for example, a SOI (Silicon On Insulator) substrate that has a support layer, a buried oxide (BOX) layer, and an active layer. In this case, as illustrated in FIG. 4, in the second drive beams 170A, 17B, the areas A41, A42, A43, A44, which are starting points of bending, are stress concentration parts, into which stresses are concentrated. When there are a support layer, a BOX layer, and an active layer in the stress concentration parts, the layers tend to be destroyed, and, especially, the BOX layer formed by a silicon oxide film (SiO2 film) tends to be destroyed.

In other words, the main cause of the destruction of the second drive beams 170A, 170B is a destruction of the BOX layer at the starting point of the bending, which is the stress concentration area. Therefore, the ribs 175A, 175B, 176A, 176B are provided at the stress concentration parts, and, as illustrated in FIG. 5A, for example, a portion of the rib 175B, surrounded by a dashed line, is located inside of an end surface of the outline, and corners are rounded in order to distribute the stress. Further, in the ribs 175A, 176A, 176B, the stresses are distributed by the same structure as the rib 175B. It should be noted that the effects of the ribs 175A, 175B, 176A, 176B are determined by their width and height. However, when the volume is increased, the primary resonance frequency is caused to be lowered. Therefore, it is necessary to obtain high deformation prevention effects with less volume. In the ribs 176A, 176B, higher deformation prevention effects are obtained with less volume by providing a semicircular ring part in the vicinity of the end of the gap between the adjacent drive beams.

Figure 6:
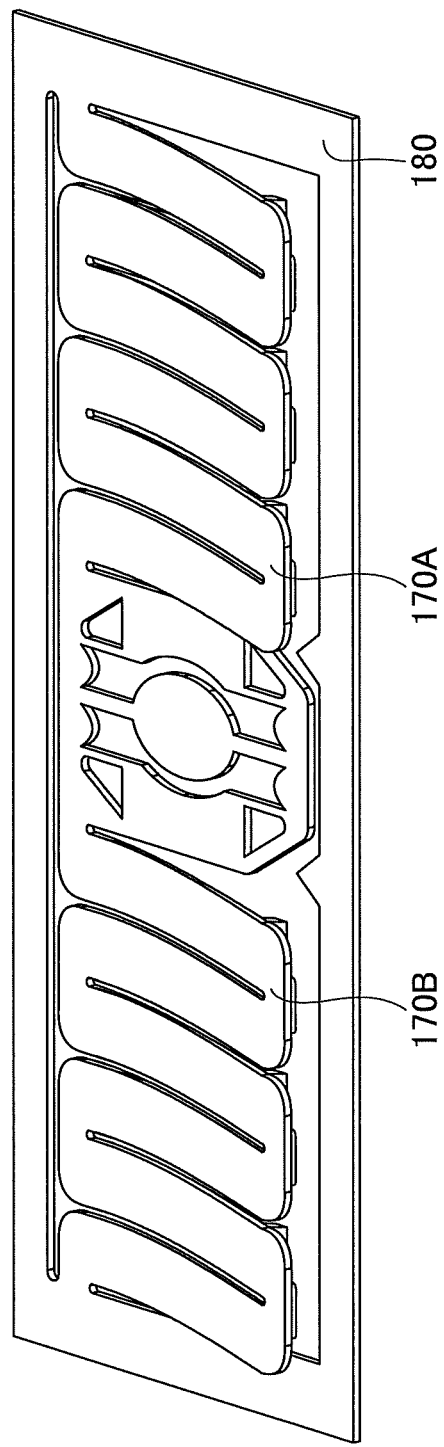
FIG. 6 is a drawing illustrating an upward warp of second drive beams.

However, in the optical scanning unit 100, as illustrated in FIG. 6, there is a case in which the second drive beams 170A, 170B warp upward with respect to the fixed frame 180 in a state where a voltage is not applied to the upper electrodes and the lower electrodes (hereinafter, referred to as an "initial state") due to a stress caused by the piezoelectric thin films, the upper electrodes, and the lower electrodes. The stress that causes the second drive beams 170A, 170B to warp upward with respect to the fixed frame 180 is referred to as a tensile stress. It should be noted that FIG. 6 is a drawing illustrating an upward warp of second drive beams. Further, when the optical scanning unit 100 is driven by having voltages applied to the upper electrodes and the lower electrodes of the second drive beams 170A, 170B that have been caused to warp upward in the initial state, the second drive beams 170A, 170B are caused to warp further upward. As a result, as illustrated in FIG. 5B, a stress is concentrated into the vicinity of the rib 175B (an area indicated by A5 in FIG. 5B), and damages tend to be generated. Further, although the damages may not be generated, because the stress is repeatedly applied to the vicinity of the rib 175B, material fatigue may be generated and the performance may be degraded.

Therefore, in an optical scanning device according to the present embodiment, the warp of the second drive beams 170A, 170B is removed by forming a stress counter film 8 that generates a stress for causing the second drive beams 170A, 170B to warp downward with respect to the fixed frame 180, on the upper electrodes of the drive sources 171A, 171B, or, between the piezoelectric thin film and the upper electrode. The stress that causes the second drive beams 170A, 170B to warp downward with respect to the fixed frame 180 is referred to as a compressive stress. According to the above arrangement, it is possible to reduce the damage of the optical scanning device and the material fatigue.

Figure 7:
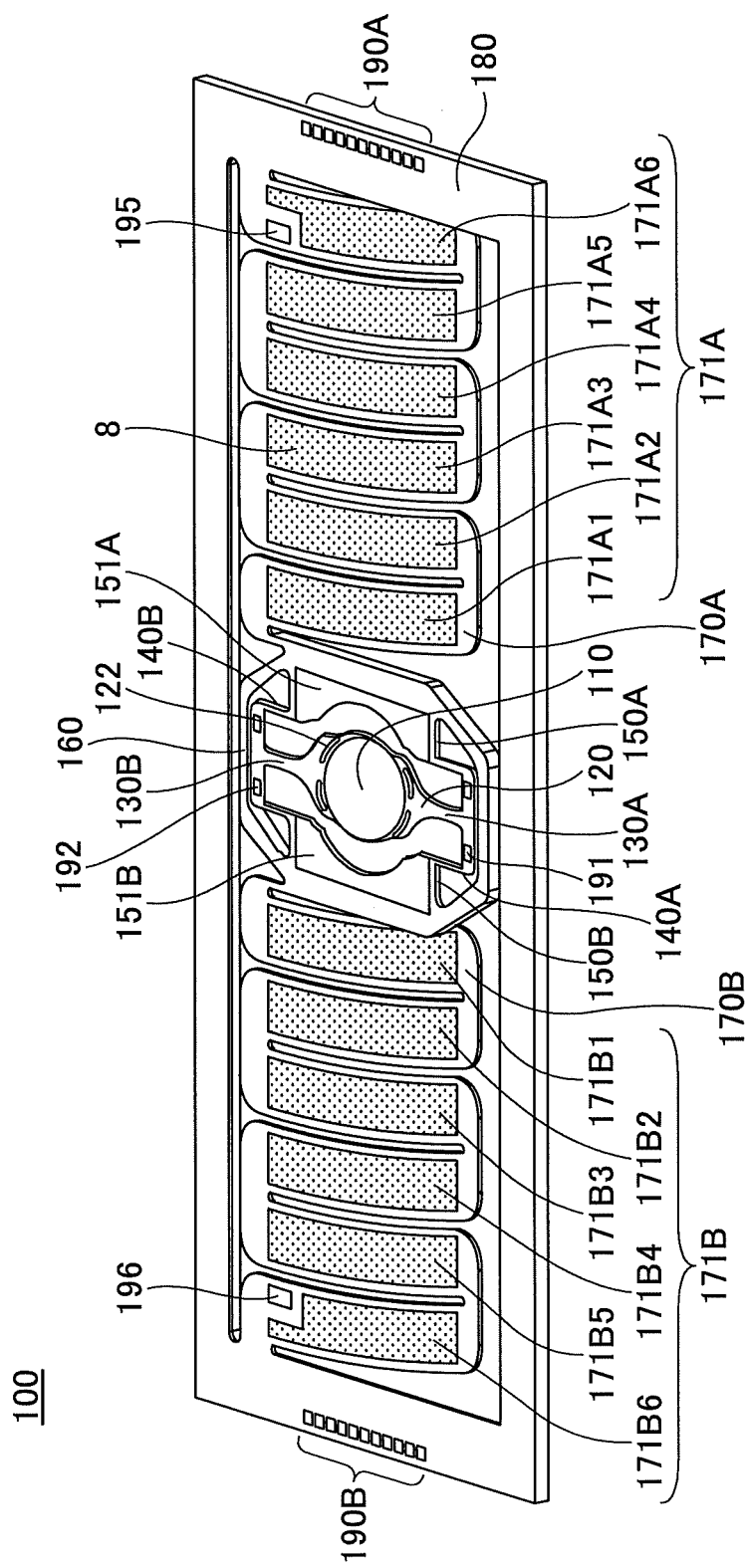
FIG. 7 is an upper surface side perspective view illustrating another example of an optical scanning unit of an optical scanning device according to the first embodiment.

Further, it is preferable that, by forming the stress counter film 8, a compressive stress be generated for causing the second drive beams 170A, 170B to be in a downward bending state (downward warping state) in which the second drive beams 170A, 170B are bent downward with respect to the fixed frame 180 in the initial state as illustrated in FIG. 7. FIG. 7 is an upper surface side perspective view illustrating another example of an optical scanning unit of an optical scanning device according to the first embodiment. In this case, if the second drive beams 170A, 170B are operated to warp upward by having voltages applied to the upper electrodes and the lower electrodes, the stress will be concentrated into the vicinities of the ribs 175A, 175B, 176A, 176B as compared to the initial state. However, because the second drive beams 170A, 170B have warped downward in the initial state, even in the case of being operated to warp upward, the second drive beams 170A, 170B do not, or do not tend to, warp upward with respect to the fixed frame 180. Therefore, it is possible to reduce damages and material fatigue of the optical scanning device 1000 as compared to an optical scanning unit 100 in which the second drive beams 170A, 170B have not warped downward in the initial state.

It should be noted that the second drive beams 170A, 170B are caused to be in a downward bending state (downward warping state) in which the second drive beams 170A, 170B are bent downward with respect to the fixed frame 180 in the initial state as described above. Further, even in a state where voltages are being applied to the upper electrodes and the lower electrodes of the second drive beams 170A, 170B and where the mirror 110 is not caused to swing, or is in a stationary state, the second drive beams 170A, 170B are still in a downward bending state (downward warping state) in which the second drive beams 170A, 170B are bent downward due to a compressive stress generated on the second drive beams 170A, 170B. At this time, an amount of bending of the second drive beams 170A, 170B is less than that in the initial state. Even according to the above configuration, it is still possible to reduce the damages and material fatigue of the optical scanning device 1000.

Figure 8:
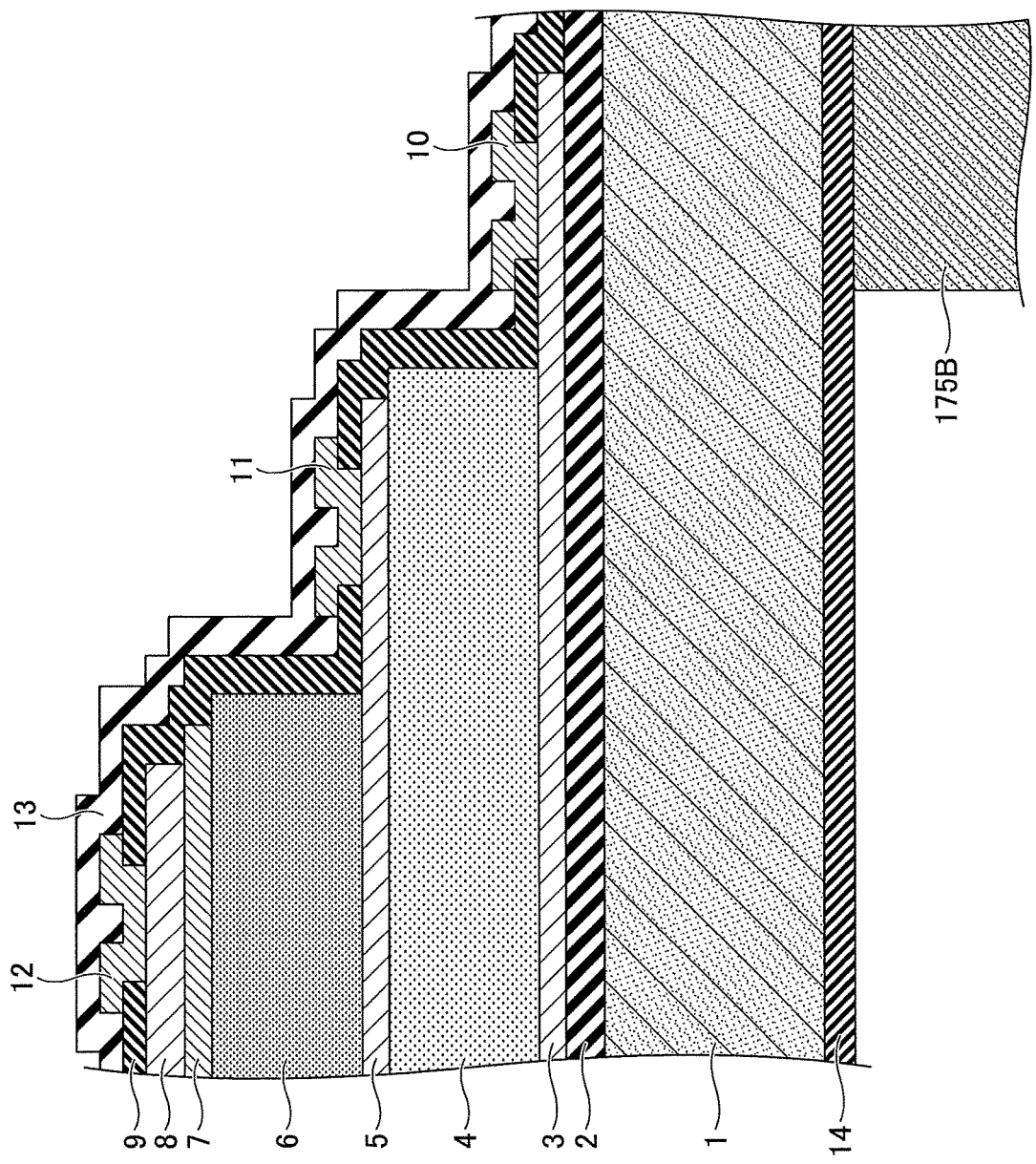
FIG. 8 is a partial cross section of an area including the rib in FIG. 4.

Next, the stress counter film 8 will be described. FIG. 8 is a partial cross section of the area A42 including the rib 175B in FIG. 4. It should be noted that the lower surface side on which the rib 175B is formed is illustrated as a downward direction.

As illustrated in FIG. 8, the optical scanning unit 100 includes, on an upper surface of a silicon substrate 1, a laminated structure in which a silicon oxide film 2, a lower electrode 3, a first piezoelectric thin film 4, an intermediate electrode 5, a second piezoelectric thin film 6, an upper electrode 7, and a stress counter film 8 are laminated in this order. Further, wirings 10, 11, 12, which are electrically insulated from each other by an interlayer insulation film 9, are connected to the lower electrode 3, the intermediate electrode 5, and the upper electrode 7, respectively. Further, on the interlayer insulation film 9 and the wirings 10, 11, 12, a protection film 13 is formed so as to cover the interlayer insulation film 9 and the wirings 10, 11, 12. Further, on a lower surface of the silicon substrate 1, a BOX layer 14 and the rib 175B are formed.

The silicon oxide film 2 can be formed by, for example, a thermal oxidation process.

The lower electrode 3, the intermediate electrode 5, and the upper electrode 7 are formed by a conductive material such as a platinum (Pt). The lower electrode 3, the intermediate electrode 5, and the upper electrode 7 can be formed by using, for example, a sputtering method and an electron beam evaporation method.

The first piezoelectric thin film 4 and the second piezoelectric thin film 6 are formed by, for example, a lead zirconate titanate (PZT) thin film. The PZT thin film is formed by using, in general, a sol-gel method in which a sol-gel solution is coated and heat treatment (drying, firing) is performed, and strong compression occurs in the heat treatment step. This causes, as described by referring to FIG. 6, a tensile stress to be generated in the second drive beams 170A, 170B, and thus, the second drive beams 170A, 170B warp upward with respect to the fixed frame 180.

The stress counter film 8 generates a compressive stress in the second drive beams 170A, 170B, and provides a counter pressure to the second drive beams 170A, 170B that warp upward with respect to the fixed frame 180 due to the tensile stress generated by the first piezoelectric thin film 4, the second piezoelectric thin film 6, the lower electrode 3, the intermediate electrode 5, the upper electrode 7, etc. This causes, as illustrated in FIG. 3, the upward warp of the second drive beams 170A, 170B to be removed, or causes, as illustrated in FIG. 7, the second drive beams 170A, 170B to warp downward with respect to the fixed frame 180. As a result, it is possible to reduce the damage and the material fatigue of the optical scanning device 100.

It is preferable that the stress counter film 8 be formed by a high melting point material from a view point of generating a strong compressive stress on the second drive beams 170A, 170B. Specifically, it is preferable that the stress counter film 8 be formed by a high melting point metal such as a TiW (Ti:W=30:70 [at %]) that is an alloy of titanium (Ti) and tungsten (W). According to the above, the stress counter film 8 functions as an electrode, and the optical scanning unit 100 can be formed without increasing element formation processes.

The stress counter film 8 can be formed by using, for example, a DC sputtering method. Conditions, under which the stress counter film 8 is formed by using the DC sputtering method, are not limited in particular. The conditions may be, for example, at normal temperature and under an argon (Ar) atmosphere. The thickness of the stress counter film 8 may be, for example, 100 nm to 1000 nm. The warp amount of the second drive beams 170A, 170B can be adjusted by adjusting the film thickness. Specifically, the warp amount of the second drive beams 170A, 170B can be increased by increasing the thickness of the stress counter film 8, and can be decreased by decreasing the thickness of the stress counter film 8.

The interlayer insulation film 9 is formed by an insulating material including, for example, an aluminum oxide film (alumina: $Al_2O_3$) and a silicon oxide film. The interlayer insulation film 9 can be formed by using, for example, a sputtering method and a chemical vapor deposition (CVD) method.

The wirings 10, 11, 12 are formed by a metal material such as a gold (Au) and an aluminum (Al). The wirings 10, 11, 12 can be formed by using, for example, a sputtering method and an electron beam evaporation method.

In the present embodiment, a first piezoelectric element is formed by the lower electrode 3, the first piezoelectric thin film 4, and the intermediate electrode 5, and a second piezoelectric element is formed by the intermediate electrode 5, the second piezoelectric thin film 6, and the upper electrode 7. As described above, the two piezoelectric elements (the first piezoelectric element and the second piezoelectric element) are sequentially connected, and thus, the warp amount of the second drive beams 170A, 170B can be greater than that of a case of using a single piezoelectric element. It should be noted that the number of the piezoelectric elements may be, for example, one or three or more.

It should be noted that the stress counter film 8 may be formed by an insulating material as long as it is capable of generating a compressive stress on the second drive beams 170A, 170B. In this case, for example, an opening is formed in the stress counter film 8, and the upper electrode 7 and the wiring 12 are caused to be electrically connected via the opening.

Further, in FIG. 8, an example of a case in which the stress counter film 8 is formed on the upper electrode 7 has been described. However, the stress counter film 8 may be formed on the second piezoelectric thin film 6, that is, may be formed between the second piezoelectric thin film 6 and the upper electrode 7.

As described above, in an optical scanning device 1000 according to the first embodiment, a stress counter film 8, which generates a compressive stress causing the second drive beams 170A, 170B to warp downward with respect to the fixed frame 180, is formed on the second piezoelectric thin film 6, or formed between the second piezoelectric thin film 8 and the upper electrode 7. According to the above, it is possible to remove the upward warp of the second drive beams 170A, 170B, and further to cause the second drive beams 170A, 170B to warp downward. As a result, it is possible to reduce the damage and the material fatigue of the optical scanning device 1000.

Second Embodiment

Figure 9:
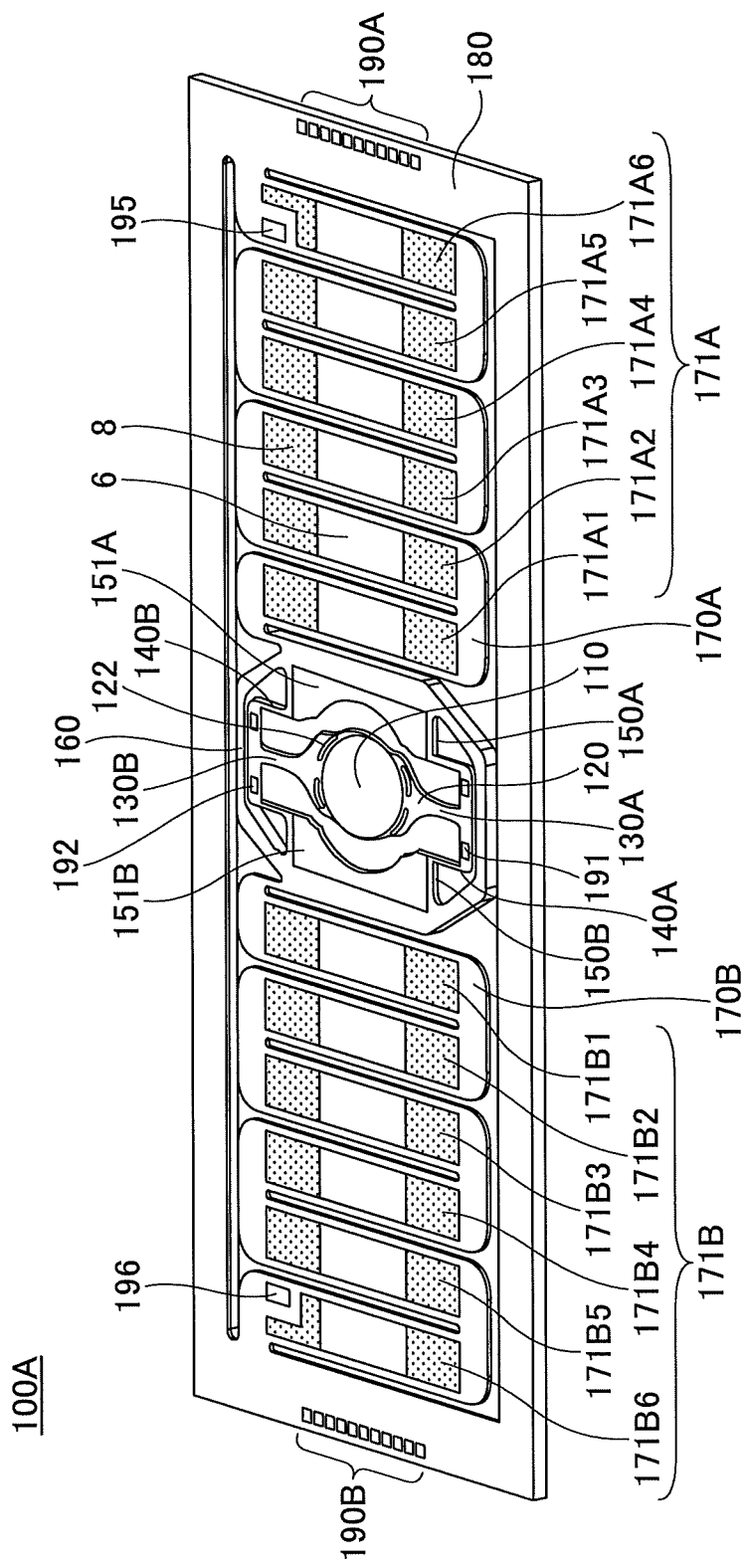
FIG. 9 is an upper surface side perspective view illustrating an example of an optical scanning unit of an optical scanning device according to a second embodiment of the present invention.

An optical scanning device according to a second embodiment of the present invention will be described. FIG. 9 is an upper surface side perspective view illustrating an example of an optical scanning unit 100A of an optical scanning device according to the second embodiment.

As illustrated in FIG. 9, the optical scanning device according to the second embodiment is different from the optical scanning device 1000 according to the first embodiment in that the stress counter film 8 is formed in a partial area on the piezoelectric thin film (second piezoelectric thin film 6) on the upper surfaces of the second drive beams 170A, 170B. It should be noted that, other than the above, configurations are the same as the optical scanning device 1000 according to the first embodiment, and thus, the descriptions of the same configurations are omitted.

On upper surfaces of the second drive beams 170A, 170B, drive sources 171A, 171B are formed as rectangle units that do not include curved portions, respectively. The drive source 171A includes an upper electrode that is formed on a piezoelectric thin film on an upper surface of the second drive beam 170A, a stress counter film 8 that is formed in the vicinity of the curved portion on an upper surface of the upper electrode, and a lower electrode that is formed on a lower surface of the piezoelectric thin film. The drive source 171B includes an upper electrode that is formed on a piezoelectric thin film on an upper surface of the second drive beam 170B, a stress counter film 8 that is formed in the vicinity of the curved portion on an upper surface of the upper electrode, and a lower electrode that is formed on a lower surface of the piezoelectric thin film.

As described above, in the optical scanning device 1000 according to the second embodiment, the stress counter film 8, which generates a compressive stress causing the second drive beams 170A, 170B to warp downward with respect to the fixed frame 180, is formed on the upper electrode, or formed between the piezoelectric thin film and the upper electrode. According to the above, it is possible to remove the upward warp of the second drive beams 170A, 170B, and further to cause the second drive beams 170A, 170B to warp downward. As a result, it is possible to reduce the damage and the material fatigue of the optical scanning device.

EXAMPLES

Next, as an example, existence or non-existence of damages of the optical scanning unit 100 was evaluated when the optical scanning device according to the first embodiment was operated for a predetermined time by using a scanning electron microscope (SEM). It should be noted that, for the comparison purposes, existence or non-existence of damages of an optical scanning unit, on which no stress counter film 8 is formed, was evaluated when an optical scanning device including the optical scanning unit was operated for a predetermined time by using the SEM.

Figure 10A:
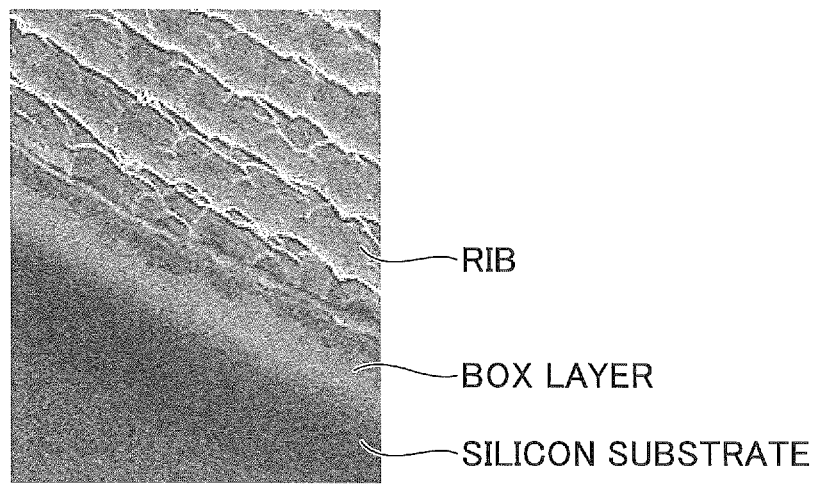
FIGS. 10A-10B are SEM images of the vicinity of the rib before and after operations of an optical scanning device according to an embodiment of the present invention.
Figure 10B:
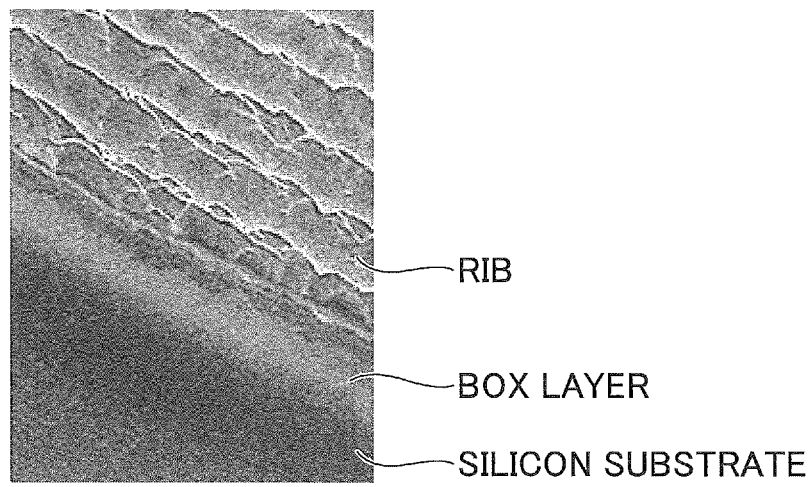
Figure 11A:
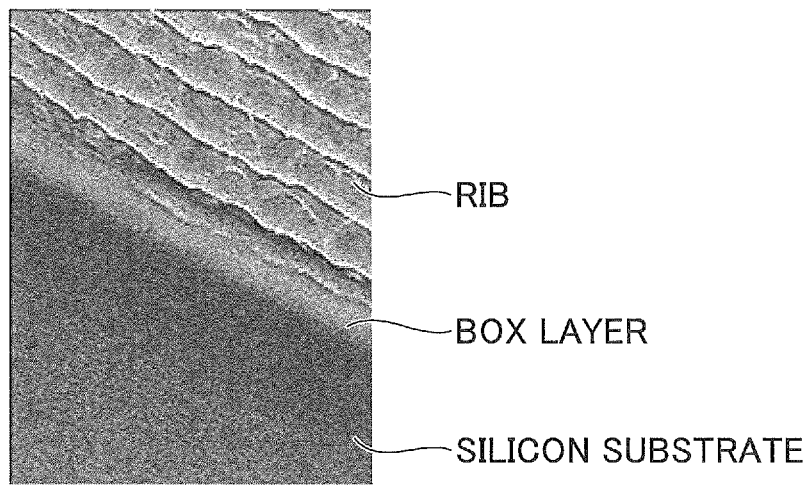
FIGS. 11A-11B are SEM images of the vicinity of the rib before and after operations of an optical scanning device according to a comparative example.
Figure 11B:
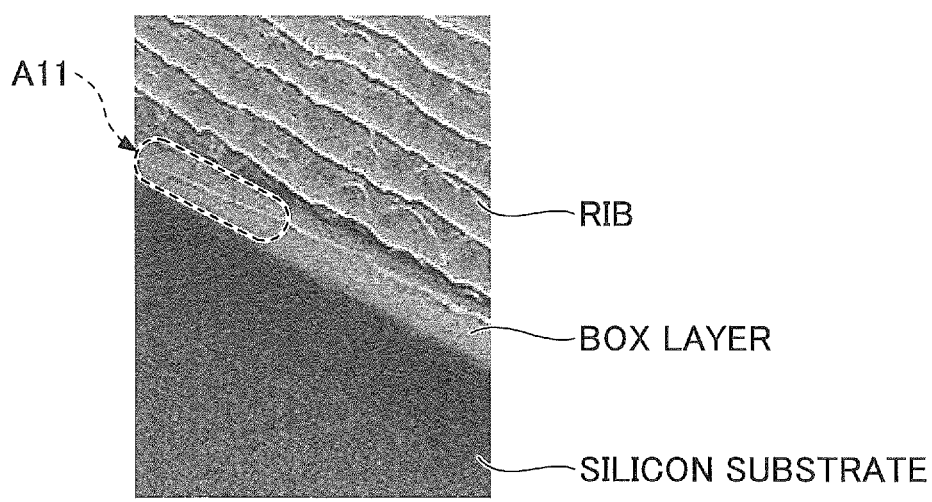

FIGS. 10A-10B are SEM images of the vicinity of the rib before and after the operations of an optical scanning device according to the first embodiment. FIGS. 11A-11B are SEM images of the vicinity of the rib before and after operations of an optical scanning device according to the comparative example. FIG. 10A and FIG. 11A illustrate the SEM images before the optical scanning devices were operated, and FIG. 10B and FIG. 11B illustrate the SEM images after the optical scanning devices were operated.

As illustrated in FIG. 10A and FIG. 10B, in the optical scanning device 1000 according to the first embodiment (including the optical scanning unit 100 with the stress counter film 8), a crack or the like was not created in the vicinity of the rib. This is considered to be because the upward warps of the second drive beams 170A, 170B were removed or the second drive beams 170A, 170B were caused to warp downward, by forming the stress counter film 8 generating a compressive stress on the upper electrode for the second drive beams 170A, 170B.

On the other hand, as illustrated in FIG. 11A and FIG. 11B, in an optical scanning device according to the comparative example (including the optical scanning unit without a stress counter film 8), a crack was created in an area A11 indicated by a dashed line between the BOX layer and the rib. This is considered to be because the second drive beams 170A, 170B were caused to warp upward due to a tensile stress generated on the second drive beams 170A, 170B by the piezoelectric thin films, electrodes, etc.; the second drive beams 170A, 170B were caused to further warp upward by operating the optical scanning device; and stresses were concentrated into the vicinity of the rib.

As described above, preferable embodiments have been described. However, the present invention is not limited to the above-described embodiments. Various modifications and replacements can be applied to the above-described embodiments within a range described in the claim.

The present application is based on and claims the benefit of priority of Japanese Priority Application No. 2016-191293 filed on Sep. 29, 2016, the entire contents of which are hereby incorporated herein by reference.

What is claimed is:

1. An optical scanning device comprising:
    a mirror that has an optical reflection surface;
    a movable frame that supports the mirror;
    a pair of drive beams that support the movable frame from both sides;
    drive sources, disposed on the drive beams, that cause the movable frame to be swung around a predetermined axis; and
    a fixed frame that supports the drive beams,
wherein each of the drive sources includes
    a lower electrode formed on the drive beams,
    a piezoelectric thin film formed on the lower electrode,
    an upper electrode formed on the piezoelectric thin film, and
    a stress counter film, formed on the upper electrode or formed between the piezoelectric thin film and the upper electrode, that generates a compressive stress on the drive beams, wherein
    the drive beams are, in a state in which the mirror is stationary, supported in a state in which the drive beams are bent with respect to the fixed frame, wherein
    ribs are formed on lower surfaces of the drive beams, and wherein the stress counter film generates the compressive stress and causes the drive beams to be bent in a direction of the lower surface on which the ribs are disposed.

2. The optical scanning device according to claim 1, wherein ribs are disposed on lower surfaces of connection portions where the drive beams and the movable frame are connected and disposed on lower surfaces of portions where the adjacent drive beams are connected to each other.

3. The optical scanning device according to claim 1, wherein the stress counter film is formed by a conductive material.

4. The optical scanning device according to claim 1, wherein the stress counter film is formed by an alloy of titanium and tungsten.

5. A manufacturing method of an optical scanning device that includes a mirror having an optical reflection surface, a movable frame supporting the mirror, a pair of drive beams supporting the movable frame from both sides, drive sources, disposed on the drive beams, causing the movable frame to be swung around a predetermined axis, and a fixed frame supporting the drive beams, the manufacturing method comprising:

a step of forming a lower electrode on the drive beams;

a step of forming a piezoelectric thin film on the lower electrode;

a step of forming an upper electrode on the piezoelectric thin film; and a step of forming a stress counter film on the upper electrode which generates a compressive stress on the drive beams according to a DC sputtering method, wherein the drive beams are, in a state in which the mirror is stationary, supported in a state in which the drive beams are bent with respect to the fixed frame, wherein ribs are formed on lower surfaces of the drive beams, and wherein the stress counter film generates the compressive stress and causes the drive beams to be bent in a direction of the lower surface on which the ribs are disposed.

* * * * *